US 6,462,961 B1

(12) United States Patent
Johnson et al.

(10) Patent No.: US 6,462,961 B1
(45) Date of Patent: Oct. 8, 2002

(54) COMPONENT HOUSING ASSEMBLY HAVING UNIVERSAL MOUNTING CAPABILITY AND MOUNTING BRACKET FOR USE THEREWITH

(75) Inventors: Andrew B. Johnson, Tomah; George R. Davis, New Lisbon; Glenn A. Priest, Mauston, all of WI (US)

(73) Assignee: Powerware Corporation, Raleigh, NC (US)

( * ) Notice: Subject to any disclaimer, the term of this patent is extended or adjusted under 35 U.S.C. 154(b) by 0 days.

(21) Appl. No.: 09/705,612

(22) Filed: Nov. 3, 2000

Related U.S. Application Data

(60) Provisional application No. 60/175,824, filed on Jan. 13, 2000.

(51) Int. Cl.[7] .......................... H02B 1/01; A47B 96/06; G12B 9/00

(52) U.S. Cl. ...................... 361/825; 312/223.2; 211/26; 248/27.1

(58) Field of Search ............................... 312/223.2, 263, 312/222, 223.1, 290, 111, 265.6, 265.5; 174/356, 57, 58, 48, 53; 361/825, 829, 683, 684, 724–727, 427; 220/3.9, 3.7, 3.3, 786, 782, 780; 248/27.1, 316.1, 222.52, 221.3, 221.4, 222.4, 223.1, 309.1, 300, 218.4; 403/261, 259, 193; 439/247, 49, 713, 31; 292/80, 19, 83, 86; 211/41.17, 41.18, 26, 189, 182, 191, 184

(56) References Cited

U.S. PATENT DOCUMENTS 5,971,507 A * 10/1999 Peroni ...................... 312/223.2

* cited by examiner

Primary Examiner—David S. Martin
Assistant Examiner—Michael L. Lindinger
(74) Attorney, Agent, or Firm—Leydig, Voit & Mayer, Ltd.

(57) ABSTRACT

Presented is a component housing assembly having universal mounting capability provided by a universal mounting bracket and a housing having a plurality of mounting holes to accommodate the attachment of the bracket in multiple configurations. Specifically, the component housing is sized to fit within a standard 19-inch rack-mount cabinet. The universal mounting bracket includes a first and a second portion in a perpendicular relationship, each having a length suitable for mounting the housing in multiple mounting configurations. In a 19-inch mounting configuration, the longer of the first and second portions of the mounting bracket is secured to the sides of the housing, allowing the shorter portion to meet with the mounting rails on the rack-mount cabinet. If a larger 23-inch rack-mount configuration or a telco rack-mount configuration is desired, the universal mounting bracket is rotated such that the shorter of the first and second portion mounts to the side of the housing, while the longer portion is adapted to accommodate the wider rails. To provide a tower-mount capability, the universal mounting bracket is again repositioned on the housing to form mounting feet that provide the required stability of a tower-mount configuration. Finally, the universal mounting bracket may be positioned on the housing to provide a wall-mount capability for the component equipment. The universal mounting bracket includes multiple wall-mount mounting holes positioned in relation to one another to accommodate differing construction standards for wall stud placement.

22 Claims, 6 Drawing Sheets

FIG. 13
FIG. 16
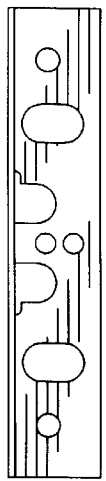 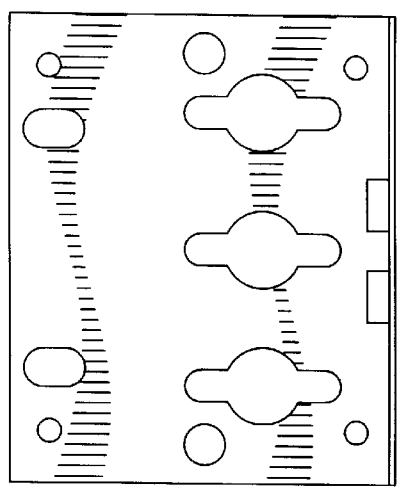 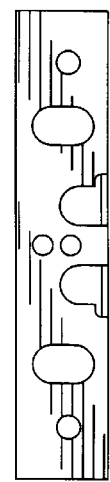
FIG. 14  FIG. 12
FIG. 15
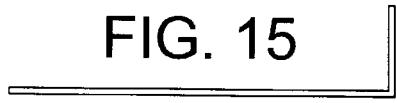
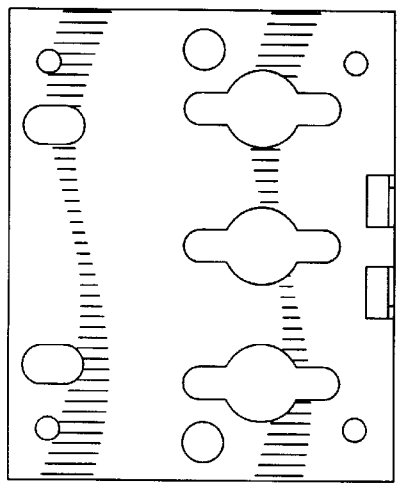
FIG. 17

COMPONENT HOUSING ASSEMBLY HAVING UNIVERSAL MOUNTING CAPABILITY AND MOUNTING BRACKET FOR USE THEREWITH

CROSS-REFERENCE TO RELATED PATENT APPLICATIONS

The present application is related to U.S. Provisional Application, Ser. No. 60/175,824, filed Jan. 13, 2000, the teachings and disclosure of which is hereby incorporated in its entirety by reference thereto.

FIELD OF THE INVENTION

The present invention relates generally to modular electronic equipment housing assemblies, and more particularly to mounting equipment and brackets for such modular electronic equipment.

BACKGROUND OF THE INVENTION

Most modern electronic equipment for home and business use is packaged in modular housings. This modularization gives consumers and businesses maximum flexibility in constructing overall systems that fit their particular needs. Particularly in the business environment, the availability of component electronic equipment allows for custom configuration of various functional components to form an overall customized system of equipment to suit the particular needs and requirements of that particular business. Such modularization also allows a business to select components from various manufacturers based on the performance of a particular vendor for the particular functional type of equipment needed. It is not uncommon for a business to select various electronic components from different manufacturers based on the performance, reliability, and cost of the individual vendors for each particular functional piece of equipment required in the overall system. As a result, many customized systems utilized in modern business include functional components manufactured by different companies, and integrated into a single operational system.

Once the individual pieces of electronic component equipment have been purchased, it is common for them to be housed in a single electronic rack or cabinet, providing the company's personnel with organized access to the front panels of such equipment. This modular component equipment is typically secured within the rack-mount housing or cabinet via screws or bolts that couple mounting holes provided as an integrated feature of the front or side panel of the equipment's housing to like mounting holes provided in the front side rails of the rack-mount cabinet or housing.

While such rack-mounting of the modular electronic equipment provides significant advantages, the lack of a single standard for the size of the rack-mount cabinetry requires that component equipment manufacturers provide at least two different sizes of housings for their equipment. While other sizes may be available, typically rack-mount cabinets and enclosures are utilized in 19-inch and 23-inch rack-mounting configurations. Further, many telephone and telecommunication companies utilize mounting racks (known as "telco" racks) that have only two mounting rails positioned to attach to the middle of the side walls of the equipment mounted therein. In order for a manufacturer's equipment to be considered by businesses, the equipment manufacturers must ensure that they provide equipment compatible with whichever type of rack-mounting system the business utilizes. This often results in significant internal redesign of the electronic packaging, particularly for functional equipment that was originally designed for a 23-inch rack-mount housing to allow it to fit in a 19-inch rack-mount housing. Similarly, the electronic packaging design of equipment originally designed to be housed in a 19-inch rack-mount housing will need to undergo some amount of rework, at least with respect to the front panel, to provide a 23-inch and a telco rack-mount option. Additionally, regardless of the internal electronic packaging design changes necessitated by the three different physically sized housings, the inventory and logistic control of these three separate stock keeping units (SKUs) adds cost for the manufacturers.

While many businesses prefer to mount their modular electronic equipment in rack-mount cabinets or housings, other businesses prefer to have their electronic equipment provided in a tower-mounting arrangement. Since typical rack-mount equipment housings include the integrated mounting flanges as part of the front panel to allow the equipment to be secured in the rack-mount housing, such equipment requires yet another packaging design to provide a tower-mount option. This requires the manufacturer to maintain yet another SKU for the same functional piece of equipment. As with the requirement for three different sizes of rack-mount packaging, the additional inclusion of tower-mount housings increases the manufacturer's cost and inventory tracking requirements. While it may be possible merely to set the modular electronics on their side, this significantly increases the risk of damage to the electronic equipment since most such equipment does not provide an adequate base in relation to its height when set on its side.

In addition to rack-mounting and tower-mounting electronic component equipment, many businesses require that this equipment be capable of being mounted on a wall. In such a configuration, the housing for the modular electronic equipment must provide mounting flanges to secure the equipment on the wall. Since electronic equipment is typically fairly heavy, it is recommended that the equipment be secured to the wall studs. Unfortunately, the distance between such studs is not governed by a single building standard. Typically wall studs are placed at either 12, 16, or 18 inches apart. Such variation in building standards often results in non-compatibility of the mounting flanges of the electronic equipment, requiring custom mounting hardware to be built for that particular client's installation. This often results in increased cost for the business, as well as the increased cost associated for the manufacturer in offering and tracking and additional SKU for this mounting configuration for the same functional piece of equipment.

BRIEF SUMMARY OF THE INVENTION

In view of the above, it is an object of the invention to provide a new and improved single modular component that is capable of being mounted in multiple mounting configurations without requiring different housing and packaging designs. It is also an object of the invention to provide a universal mounting bracket for use with modular components that enables them to be mounted in multiple mounting configurations. These multiple mounting configurations preferably include mounting in standard 19 and 23 inch rack mount chassises, telephone company-type (telco) chassises, tower mounting, and wall mounting. Through the provision of the present invention businesses need only stock and track a single SKU regardless of their clients' mounting requirements, which significantly reduces inventory control costs and improves customer satisfaction.

In one embodiment of the invention, a modular component equipment assembly having universal mounting capability comprises a housing and a pair of universal mounting brackets. Each of the mounting brackets have a first portion and a second portion arranged in perpendicular relation to each other. The second portion is preferably wider than the first portion. This first portion defines a first set of bracket mounting holes, and the second portion defines a second set of bracket mounting holes. In this embodiment, the first portion of the universal mounting brackets may be attached to either side of the housing to form wide outward depending mounting flanges. The second set of bracket mounting holes are positioned on this second portion such that the distance between the second set of bracket mounting holes on each universal mounting bracket is adapted to align with external mounting holes on an external rack mount chassis. Further, when the second portion of the universal mounting brackets is attached to either side of the housing to form short outward depending mounting flanges, the first set of bracket mounting holes are positioned such that a distance between these bracket mounting holes on each universal mounting bracket is adapted to align with mounting holes on a smaller rack mount chassis.

The housing preferably defines two sets of mounting holes on two sides. In this embodiment the first portion of the bracket also defines a set of housing mounting holes that are adapted to align with one set of mounting holes of the housing. The second portion defines another set of housing mounting holes that are adapted to align with the other set of mounting holes of the housing.

When the housing is to be oriented in a tower mount configuration, the first portion of the universal mounting brackets are attached to opposite sides of the housing at a lower portion relative to the tower mount orientation. In this way, the second portion forms mounting feet to increase the stability of the tower mount. The housing defines another set of mounting holes on opposite sides at the lower portion that are adapted to align with the set of mounting holes in the first portion of the bracket.

Preferably, the universal mounting brackets further define wall mounting holes in their second portions. When the housing is to be oriented in a wall mount configuration, the first portion of the universal mounting brackets are attached to at least one side of the housing. These brackets are positioned in a spaced relationship to one another such that the distance between an inner-most pair of the wall mounting holes align with wall studs constructed with centers at a first distance. In this embodiment, a second distance between the middle pair of wall mounting holes align with wall studs constructed with centers at a second distance. Finally, the distance between the outer-most pair of wall mounting holes on the adjacent universal mounting brackets align with wall studs constructed with centers at a third distance. For example, the distances for the wall studs could be 12, 14, and 16 inch centers as is common. The second portion may also include a plate cover mounting hole to accommodate aesthetic plate covers that snap fit in the plate cover mounting hole.

In one embodiment the housing forms a rectangular box having a front surface whose width exceeds its height, a pair of side walls, a top surface, and a bottom surface. In this embodiment the universal mounting brackets are attached to the pair of side walls to enable mounting of the housing in a rack mount chassis. The mounting flanges so formed extend parallel with the front surface. The first portion of the universal mounting brackets are alternatively attached to the top and bottom surfaces to enable a tower mounting of the housing by forming mounting feet extending perpendicular to the front surface. Additionally, the first portion of the universal mounting brackets may be attached to the pair of side walls to enable a wall mounting of the housing. In this case, the second portions form wall mounting flanges that extend perpendicular to the front surface.

Preferably, the first portion defines a first set of housing mounting holes and the second portion defines a second set of housing mounting holes. Further, the pair of side walls define a first and a second set of mounting holes positioned to align with the first and the second set of mounting holes, respectively, to enable rack mounting of the housing in two different sized rack mount chassises. To enable telco rack mounting, the pair of side walls define a third set of mounting holes positioned to align with the first set of mounting holes. Additionally, a fourth and fifth set of mounting holes are each positioned on the housing to align with the first set of housing mounting holes to enable wall mounting of the housing. Finally, the top and bottom surfaces of the housing define a sixth and seventh set of mounting holes, each positioned to align with the first set of housing mounting holes to enable tower mounting of the housing.

In a further embodiment of the present invention, a universal mounting bracket for use with modular component equipment comprises a first portion and a second portion. The first portion defines a first set of housing mounting holes and a first set of rack mounting holes, and the second portion defines a second set of housing mounting holes and a second set of rack mounting holes. The second portion is positioned perpendicular to the first portion and has a length greater than a length of the first portion. Preferably, the second set of rack mounting holes are positioned along the length of the second portion such that they align with external mounting holes of a wide rack mount or telco chassis when the bracket is mounted to the modular component equipment. Also, the first set of rack mounting holes are preferably positioned along the length of the first portion such that they align with external mounting holes of a different rack mount chassis that is smaller than the first rack mount chassis when the bracket is mounted to the modular component equipment. In one embodiment, the set of rack mounting holes positioned along the length of the second portion align with external mounting holes of a 23-inch rack mount chassis and to a telco chassis when the bracket is mounted to the modular component equipment. The first set of rack mounting holes are positioned along the length of the first portion such that they align with external mounting holes of a 19-inch rack mount chassis when the bracket is mounted to the modular component equipment.

Preferably, the second portion further defines a first and a second wall mount hole positioned a distance apart. This distance is one half of a distance differential between building standards for wall stud placement, e.g. one inch when the standards are 12 and 14 inch centers. In a further embodiment, the second portion further defines a third wall mount hole positioned the same distance from the second wall mount hole. The second portion may further define an aesthetic cover mounting hole. Preferably, the bracket comprises a flat metal plate into which the sets of housing mounting holes, the sets of rack mounting holes, the three wall mount holes, and the aesthetic cover mounting hole are punched. The first and the second portion are then formed by bending the metal plate. In an additional embodiment the first portion further defines a pair of clearance holes.

In a alternate embodiment of the invention, a modular uninterruptible power supply (UPS) system for supplying electric power from line voltage and external batteries is presented. This UPS system comprises an UPS module and a plurality of universal mounting brackets. These brackets are adapted to couple to the UPS module in a first position to enable mounting of the UPS module in a first rack mount chassis, in a second position to enable mounting of the UPS module in a second rack mount chassis wider than the first rack mount chassis, in a third position to enable mounting of the UPS module in a tower mount configuration, in a fourth position to enable mounting of the UPS module on a wall, and in a fifth position to enable mounting of the UPS module in a telco rack mount. Preferably, the universal mounting bracket comprises a first portion, and a second portion that is wider than the first portion. This second portion is coupled to the UPS module in the first position, and the first portion is coupled to the UPS in the second, third, fourth, and fifth positions.

This UPS system further comprises at least a second UPS module and a joinder plate. In this embodiment the UPS modules are positioned adjacent to one another in the tower mount configuration. The joinder plate is then coupled to the adjacent UPS modules to maintain their relative position. The universal mounting brackets are coupled in the third position to an outside surface of the UPS modules to form mounting feet.

In one embodiment, at least two universal mounting brackets are coupled on a same horizontal side of the UPS module in the fourth position, and the universal mounting bracket includes at least two wall mount holes. The wall mount holes are positioned relative to one another such that one of the wall mount holes from each universal mounting bracket will align with an external wall stud center of a wall constructed in accordance with a first standard, and such that the other of the wall mount holes from each universal mounting bracket will align with an external wall stud center of a wall constructed in accordance with a second standard. Preferably, the universal mounting bracket includes a third wall mount hole. The wall mount holes are then positioned relative to one another such that the third of the wall mount holes from each universal mounting bracket will align with an external wall stud center of a wall constructed in accordance with a third standard.

Other objectives and advantages of the invention will become more apparent from the following detailed description when taken in conjunction with the accompanying drawings.

BRIEF DESCRIPTION OF THE DRAWINGS

The accompanying drawings incorporated in and forming a part of the specification illustrate several aspects of the present invention, and together with the description serve to explain the principles of the invention. In the drawings:

FIG. 12 is a front planar view of the mounting bracket of FIG. 1;

FIG. 13 is a side planar view of the universal mounting bracket of FIG. 1;

FIG. 14 is a rear planar view of the universal mounting bracket of FIG. 1;

FIG. 15 is an alternate side planar view of the universal mounting bracket of FIG. 1;

FIG. 16 is a top planar view of the universal mounting bracket of FIG. 1; and

FIG. 17 is a bottom planar view of the universal mounting bracket of FIG. 1.

While the invention will be described in connection with certain preferred embodiments, there is no intent to limit it to those embodiments. On the contrary, the intent is to cover all alternatives, modifications and equivalents as included within the spirit and scope of the invention as defined by the appended claims.

DETAILED DESCRIPTION OF THE INVENTION

Figure 1:
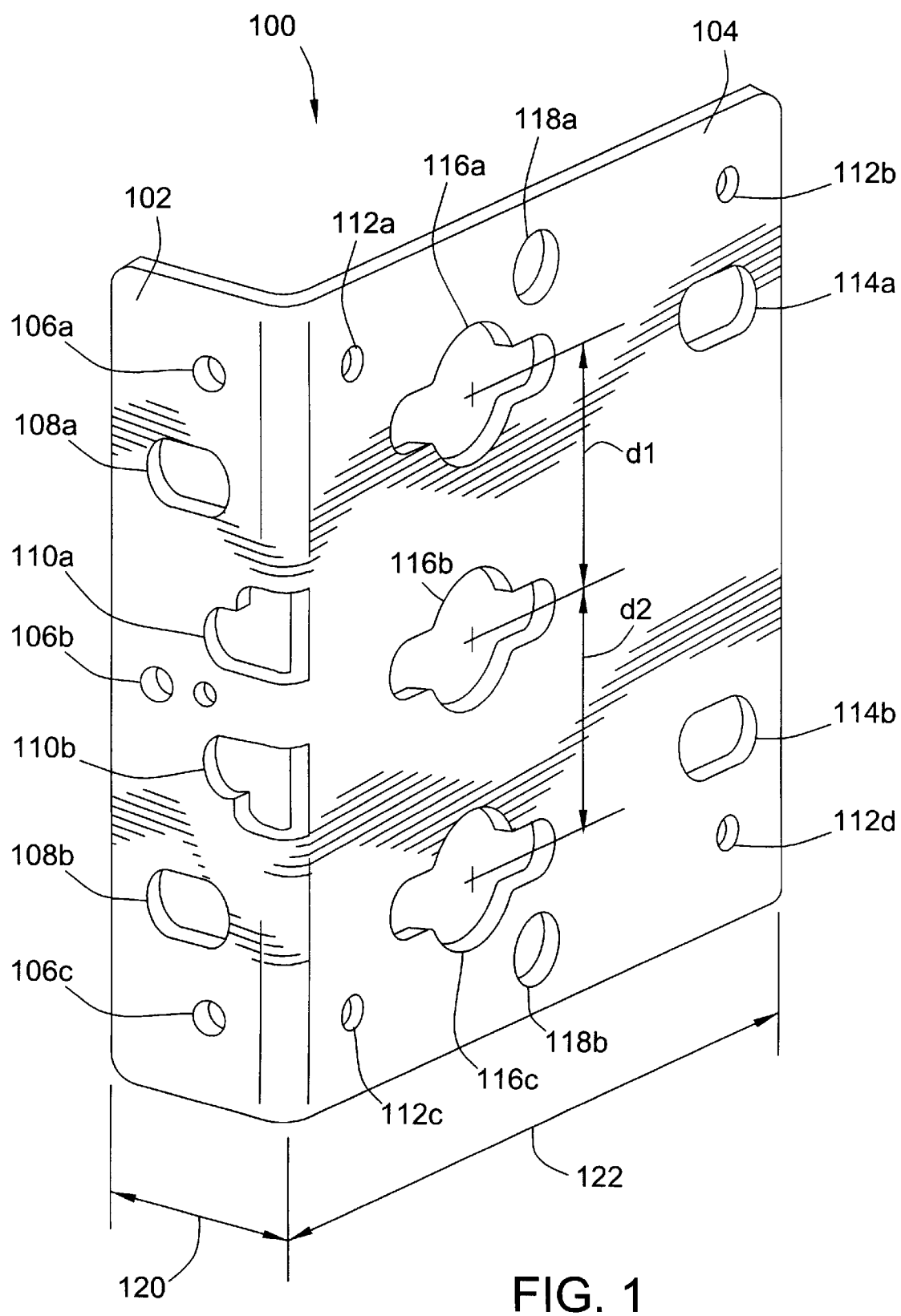
FIG. 1 is an isometric illustration of a universal mounting bracket constructed in accordance with the teachings of the present invention.

Turning now to the drawings, and in particular to FIG. 1, there is illustrated an embodiment of a universal mounting bracket constructed in accordance with the teachings of the present invention that enables the modular electronic component equipment to be mounted in a plurality of standard mounting configurations. This universal mounting bracket 100 provides a first 102 and a second 104 portions located in a perpendicular relationship to one another forming an L-type bracket. Each of these portions 102, 104 provide a plurality of mounting holes located in a functional relationship with one another as will be described more fully below. In particular, the first bracket portion 102 defines therein three housing mounting holes $106_a$, $106_b$, $106_c$, located in a triangular relationship with one another to provide mechanical rigidity when mounted to the modular electronic component housing as will be described below. This portion 102 also includes two rack-mount mounting holes $108_a$ and $108_b$ utilized for Counting the modular electronic component equipment in a standard 19-inch rack-mount cabinet or housing. In the embodiment illustrated in FIG. 1, two clearance holes $110_a$ and $110_b$ are also included in this first portion 102 should they be needed to accommodate access points, screws, etc. located on the modular electronic component housing as desired.

The second portion 104 of the universal mounting bracket 100 also contains a plurality of mounting holes positioned in a functional relationship to one another as will now be discussed. Specifically, this second portion 104 includes a plurality of housing mounting holes $112_a$, $112_b$, $112_c$, and $112_d$ to allow mounting of this bracket 100 to the modular electronic component housing for installation of the equipment in a standard 19-inch mounting bracket. One skilled in the art will recognize that while these mounting holes $112_{a-d}$ dare located in a rectangular relationship on this second portion 104 of mounting bracket 100, adequate structural rigidity may be achieved through the provision of fewer mounting holes, for example in a triangular relationship. This portion 104 also include, two mounting holes $114_a$ and $114_b$ that are utilized to mount the modular electronic component equipment in a standard 23-inch rack-mount housing or cabinet, and in a telco mounting chassis as will be described more fully below.

This portion also defines wall-mount mounting holes $116_a$, $116_b$, and $116_c$, one of which is utilized to mount the modular electronic component equipment in a wall-mount configuration. The selection of which of the three wall-mount mounting holes $116_{a-c}$ that will be utilized is determined by the center spacing of the studs used to construct the particular wall on which the modular electronic component equipment is to be mounted as will be described more fully below. Finally, this portion 104 of the mounting bracket 100 also includes two aesthetic plate holes $118_a$ and $118_b$ that are utilized to secure aesthetic plate covers (not shown) when the modular electronic component equipment is to be utilized in a tower-mount configuration.

In addition to the unique configuration and relationship between the plurality of mounting holes included on both portions 102 and 104 of the universal mounting bracket 100, particular advantage is provided by the relative lengths 120 and 122 of these portions 102, 104, respectively. Specifically, these relative lengths 120, 122 allow a single electronic component housing design to be utilized for the standard 19- and 23-inch rack-mount configurations and the telco mounting configuration most commonly encountered in the electronic component and telecommunication industry. Likewise, the spacing between the wall-mount mounting holes $116_{a-c}$ allows this universal mounting bracket to be utilized regardless of the standard stud spacing with which the wall onto which the electronic component is to be mounted was constructed. These distances $d_1$, and $d_2$, when taken cumulatively with another universal mounting bracket used in the wall-mount configuration (as will be described more fully below) accommodate the standard 12-, 14-, and 16-inch centers used in typical construction.

Figure 2:
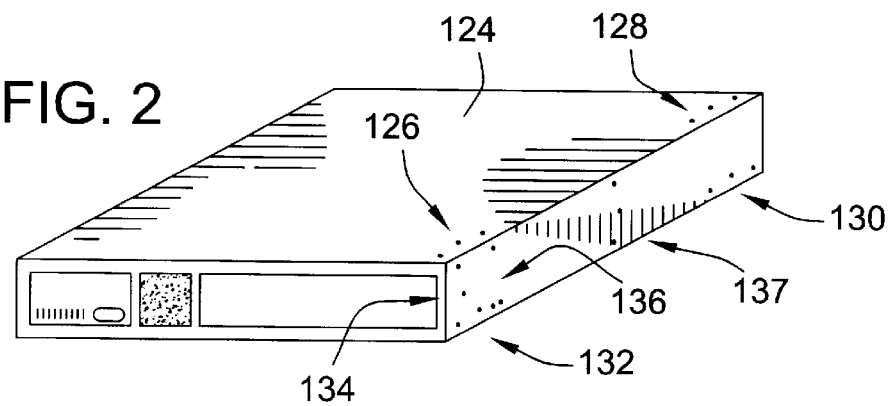
FIG. 2 is an isometric illustration of a modular electronic component housing constructed in accordance with the teachings of the present invention.

The modular electronic component equipment housing constructed in accordance with the teachings of the invention is illustrated in multiple views in FIGS. 2, 3, 4, and 5. Together, these FIGS. 2–5 illustrate the mounting relationship of the housing 124 with the bracket 100. Turning first to FIG. 2, the modular electronic component housing 124 is illustrated in a front top right side view. As may be seen in this view, the top of the housing 124 includes two sets of mounting holes 126, 128, each configured in a triangular relationship to align with mounting holes $106_{a-c}$ (see FIG. 1). As will become apparent in the following description, these two sets of mounting holes 126, 128 are utilized to allow the universal mounting bracket illustrated in FIG. 1 to serve as a base footing when the modular electronic component equipment is mounted in a tower-mount configuration. One skilled in the art will recognize that, while FIG. 2 illustrates only two sets 126, 128 of mounting holes for the tower-mount configuration, additional sets could be utilized to allow the modular component equipment to be mounted with either side in the upright position as desired.

In the embodiment of the modular electronic component equipment housing 124 shown in FIG. 2, the right side panel of the housing 124 includes a plurality of mounting holes at both the forward, middle, and rearward end thereof. At the rearward end, a grouping 130 of mounting holes are positioned in a triangular relationship to align with mounting holes $106_{a-c}$ of the universal mounting bracket 100 illustrated in FIG. 1 when the modular equipment is to be mounted in a wall-mount configuration. A second set 132 of mounting holes are positioned in a forward lower horizontal position in a triangular relationship to align with mounting holes $106_{a-c}$ of the universal mounting bracket 100 illustrated in FIG. 1, also to secure the equipment 124 when utilized in a wall-mount configuration. It should be noted that while the embodiment of the modular electronic component equipment housing 124 illustrated in FIG. 2 includes only two sets 130 and 132 of wall-mount mounting holes, one skilled in the art will recognize that two additional sets of mounting holes could be positioned along a top horizontal edge of the side wall to allow wall mounting of the housing 124 with the top surface against the wall as desired.

A second grouping of mounting holes 134 positioned at a forward vertical location of the housing 124 as illustrated in FIG. 2 is also included. This forward vertical grouping 134 is positioned in a triangular relationship to mate with mounting holes $106_{a-c}$ of the universal mounting bracket 100 illustrated in FIG. 1 when the modular equipment 124 is mounted in a standard 23-inch rack-mount configuration. A third grouping of mounting holes 136 is included in this forward position of the side wall of housing 124. This grouping of mounting holes 136 is configured to align with the mounting holes $112_{a-d}$ of the universal mounting bracket 100 illustrated in FIG. 1 when the modular component equipment 124 is mounted in a standard 19-inch rack-mount configuration. A fourth grouping of mounting holes 137 is positioned in a triangular relationship to mate with mounting holes $106_{a-c}$ of the universal mounting bracket 100 when the modular equipment 124 is to be mounted in a telco chassis.

Figure 3:
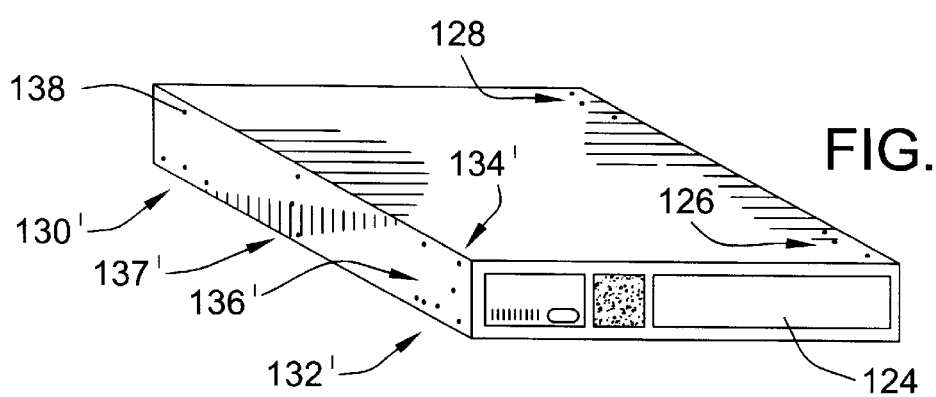
FIG. 3 is an alternate view of the isometric illustration of the modular electronic component housing illustrated in FIG. 2.

A front top left side view of the modular electronic component equipment housing 124 is illustrated in FIG. 3. As may be seen from this view of the component housing 124, the front portion of the left side wall includes the three sets of mounting hole patterns 132', 134', 136', 137' corresponding to the mounting hole patterns 132, 134, 136, 137 discussed above. Likewise, the bottom rearward portion of the side wall of housing 124 includes a mounting hole pattern 130' corresponding to the pattern 130 discussed above with regard to FIG. 2. In addition to these reciprocal mounting hole patterns, the left side of housing 124 also includes a mounting hole 138 to allow multiple modular electronic components to be coupled in a single tower-mount configuration as will be described more fully below.

Figure 4:
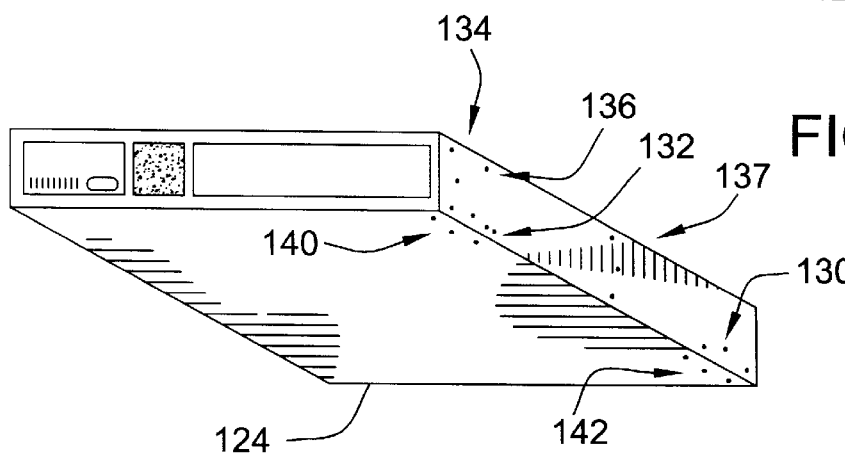
FIG. 4 is a further alternate view of the isometric illustration of the modular electronic component housing illustrated in FIG. 2.
Figure 5:
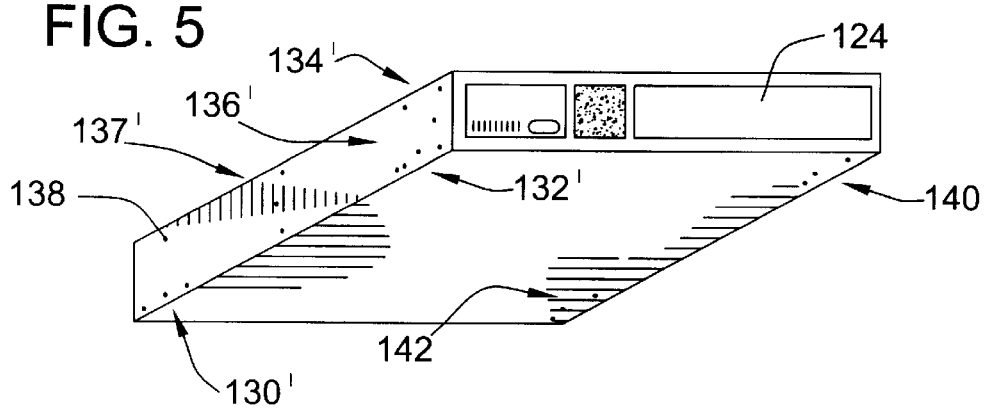
FIG. 5 is a further alternate view of the isometric illustration of the modular electronic component housing of FIG. 2.

FIG. 4 illustrates an alternate view of the modular electronic component housing 124 constructed in accordance with the teachings of the present invention. Specifically, FIG. 4 illustrates a front bottom right side view of the housing 124. As may be seen from this view, two additional sets of mounting holes 140, 142 are included on the bottom surface of housing 124. These mounting holes 140, 142 are provided in a triangular relationship to align with mounting holes $106_{a-c}$ of the universal mounting bracket 100 illustrated in FIG. 1 when the equipment 124 is to be mounted in a tower-mount configuration. FIG. 5 illustrates a front bottom left side view of the housing 124. While both FIG. 4 and FIG. 5 illustrate only mounting hole groupings 140, 142 on the bottom right hand side of the housing 124, one skilled in the art will recognize that similar mounting hole patterns could be included on the left bottom side of housing 124 to allow the component electronic equipment to be mounted in a tower configuration having the right hand side in an upward orientation as desired.

Figure 6:
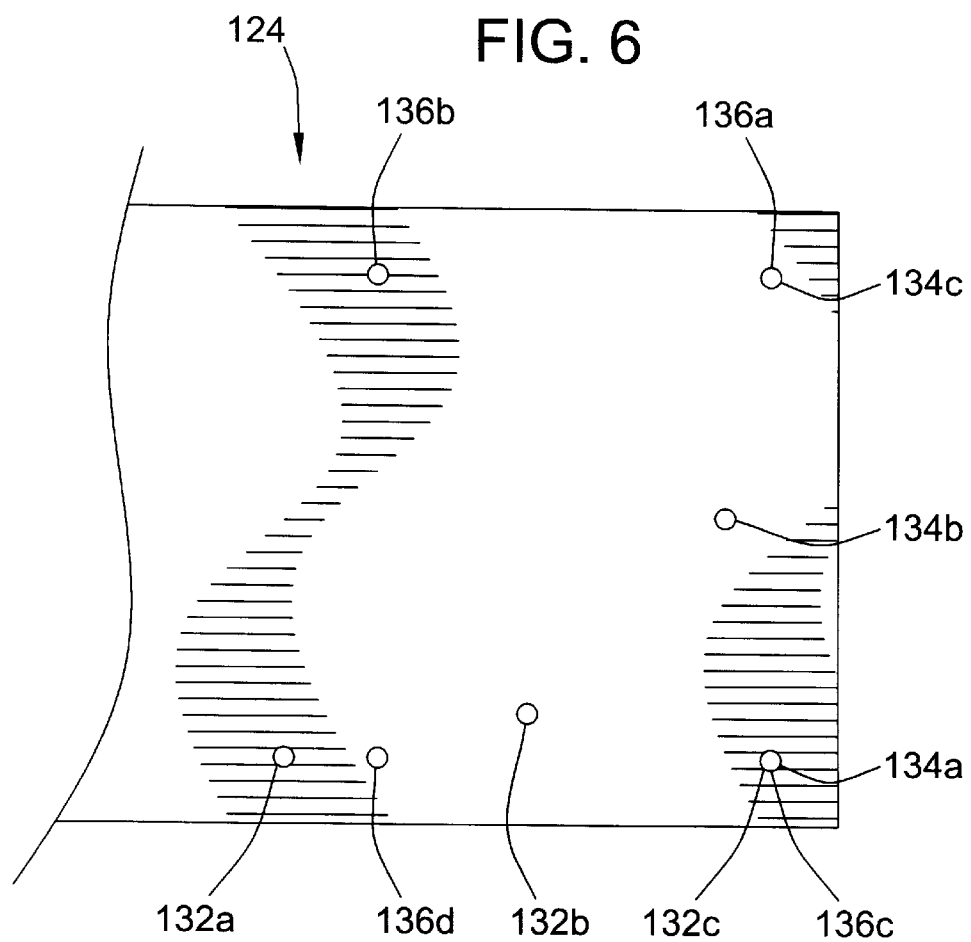
FIG. 6 is a cut-away side view of a portion of the modular electronic component housing of FIG. 2 illustrating an aspect of the present invention.

The mounting hole patterns included on the forward side walls of the modular electronic component housing 124 are illustrated in the cut-away partial side view of the housing 124 in FIG. 6. As may be seen in this FIG. 6, the lower mounting hole pattern 132 (see FIGS. 2–5) comprises three individual mounting holes $132_a$, $132_b$, and $132_c$, positioned in a triangular relationship to align with mounting holes $106_{a-c}$ of the universal mounting bracket 100 illustrated in FIG. 1. The mounting pattern 134 provided along the front vertical edge of housing 124 (see FIGS. 2–5) actually comprises three individual mounting holes $134_a$, $134_b$ and $134_c$ positioned in a triangular relationship adapted to align with mounting holes $106_{a-c}$ of the universal mounting bracket 100 illustrated in FIG. 1. The mounting hole pattern 136 illustrated in FIGS. 2–5 comprises four individual mounting holes $136_a$, $136_b$, $136_c$ and $136_d$ as illustrated in FIG. 6. As will be apparent to those skilled in the art, these three mounting hole patterns 132, 134, and 136 each share at least one hole with the other patterns. As illustrated in FIG. 6, mounting pattern 132, 134, and 136 all share one common hole (illustrated as mounting hole $132_c$, $134_a$ and $136_c$). Additionally, mounting hole patterns 134 and 136 share an additional common mounting hole (illustrated as mounting hole $134_c$ and $136_a$).

Figure 7:
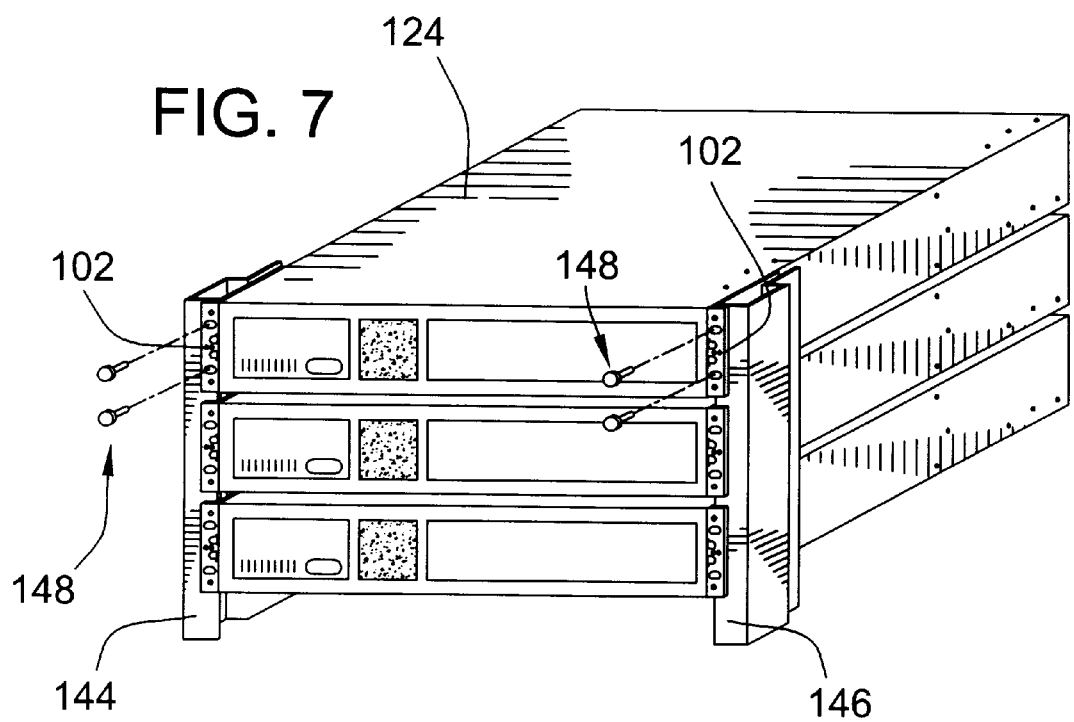
FIG. 7 is an isometric illustration of a modular electronic component constructed in accordance with the teachings of the present invention being mounted in a standard 19-inch rack-mount cabinet.

Having now described both the universal mounting bracket 100 and the modular electronic component equipment housing 124 individually, attention is now directed to FIG. 7 which illustrates the functional relationship of these components allowing mounting of the resulting assembly in a standard 19-inch rack-mount cabinet or enclosure. In this configuration, the second portion 104 (see FIG. 1) of the universal mounting bracket 100 is secured to the side walls of the housing 124 such that the first portion 102 of the bracket 100 provides an outward depending mounting surface. In this configuration, the mounting holes $108_a$, $108_b$ align with mounting holes in the rack-mount front rails 144, 146 to secure the modular electronic component therein. As illustrated in this FIG. 7, this securing function is performed through the use of screws or bolts 148, although other types of fasteners may be utilized as appropriate.

Figure 8:
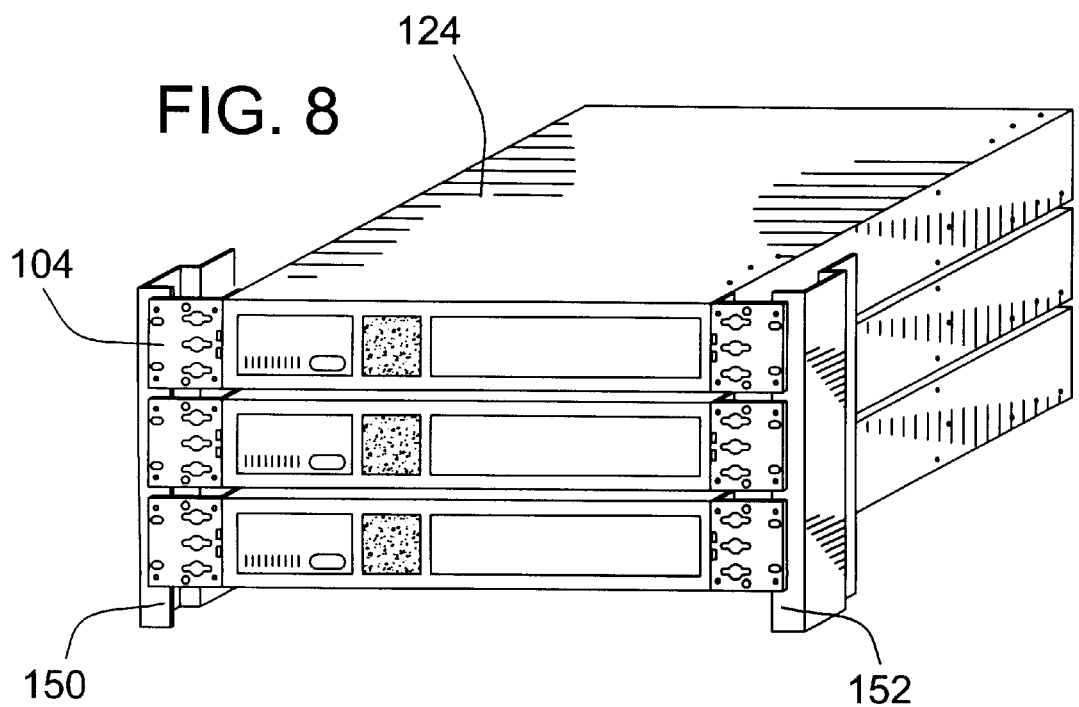
FIG. 8 is an isometric illustration of a modular electronic component constructed in accordance with the teachings of the present invention being mounted in a standard 23-inch rack-mount cabinet.

If the modular electronic equipment 124 is to be mounted in a standard 23-inch rack-mount configuration as illustrated in FIG. 8, the universal mounting bracket 100 is removed from the sides of the equipment housing 124, and reattached utilizing the mounting holes $106_a$, $106_b$, and $106_c$ on the first portion 102 of bracket 100 (see FIG. 1). Once this first portion 102 is secured to the sides of the housing 124, the second portion 104 forms outward depending mounting flanges that extend the front profile of the equipment to fit within a standard 23-inch rack-mount cabinet or housing. Specifically, the mounting holes $114_a$ and $114_b$ may now be aligned with mounting holes in the front rails 150, 152 of the 23-inch rack-mount cabinet or enclosure to secure the equipment therein.

Figure 9:
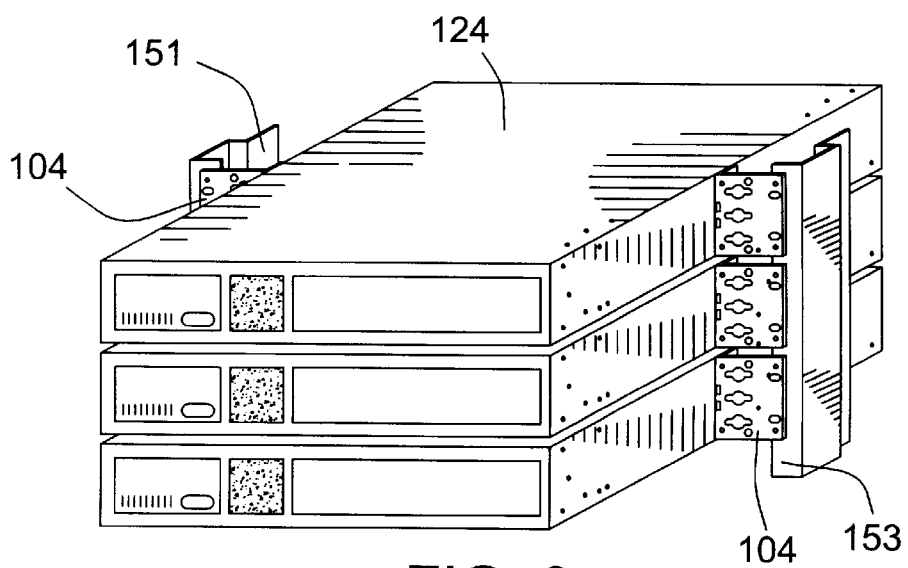
FIG. 9 is an isometric illustration of a modular electronic component constructed in accordance with the teachings of the present invention being mounted in a tower-mounting configuration.

If the modular electronic equipment 124 is to be mounted in a telco rack-mount configuration as illustrated in FIG. 9, the universal mounting bracket 100 is attached to mounting holes 137 and 137' (see FIGS. 2–5) utilizing the mounting holes $106_a$, $106_b$, and $106_c$ on the first portion 102 of bracket 100 (see FIG. 1). Once this first portion 102 is secured to the sides of the housing 124, the second portion 104 forms outward depending mounting flanges that mount to the rails 151, 153 of the telco rack-mount cabinet or housing. Specifically, the mounting holes $114_a$ and $114_b$ may now be aligned with mounting holes in the front rails 151, 153 of the telco cabinet or enclosure to secure the equipment therein. As will now be apparent to those skilled in the art, through the provision of the universal mounting bracket 100 and the equipment housing 124, a single modular electronic component assembly may now be utilized regardless of the rack-mount standard utilized by any particular business. This provides significant advantage in that only a single SKU need be maintained by a manufacturer regardless of the type of enclosure into which the equipment is to be mounted.

Figure 10:
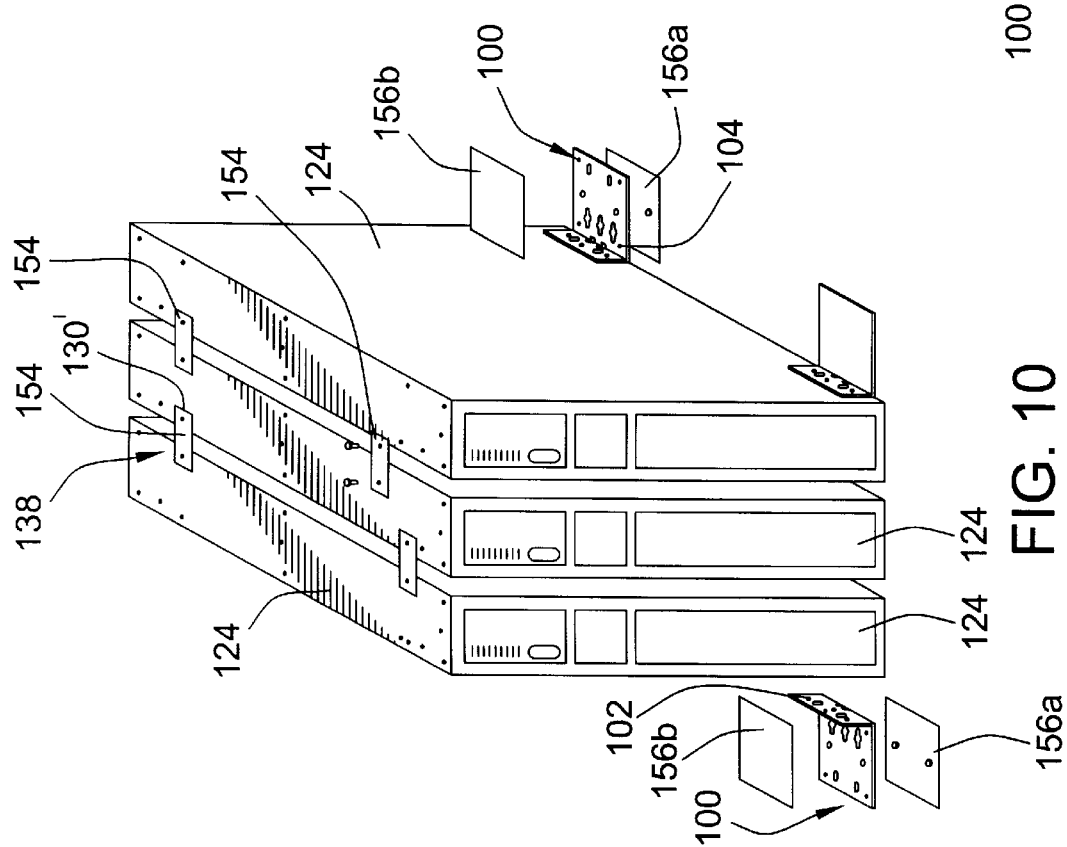
FIG. 10 is an isometric illustration of a modular electronic component constructed in accordance with the teachings of the present invention being mounted in a wall-mount configuration.

As illustrated in FIG. 10, the housing 124 and mounting bracket 100 of the present invention may also be utilized to allow a customer to orient their modular electronic component equipment in a tower-mount configuration. When utilized in the tower-mount configuration, the first portion 102 of the mounting bracket 100 is secured to the housing 124 on its "top" and "bottom" surfaces utilizing the mounting hole patterns 126, 128, 140, and 142 illustrated in FIGS. 3, 4, and 5. The second portion 104 of the universal mounting brackets 100 form outward depending mounting feet that greatly enhance the stability of the vertically-oriented tower-mount configuration. As illustrated in FIG. 10, if multiple components are to be mounted in a single tower-mount configuration, joinder plates 154 may be utilized to hold the equipment in their tower-mount configuration. These joinder plates 154 are secured to the housings 124 by aligning with mounting holes 138 and one of the mounting holes of mounting group 130 on the rearward portion, and by aligning with mounting holes $136_b$ and $136_d$ (see FIG. 6) on adjacent modular components. Aesthetic cover plates $156_a$, $156_b$ may be provided to cover the various mounting holes provided in the second portion 104 of the universal mounting bracket 100. These aesthetic cover plates may preferably be snap-fit together through mounting holes $118_a$, $118_b$ (See FIG. 1).

Figure 11:
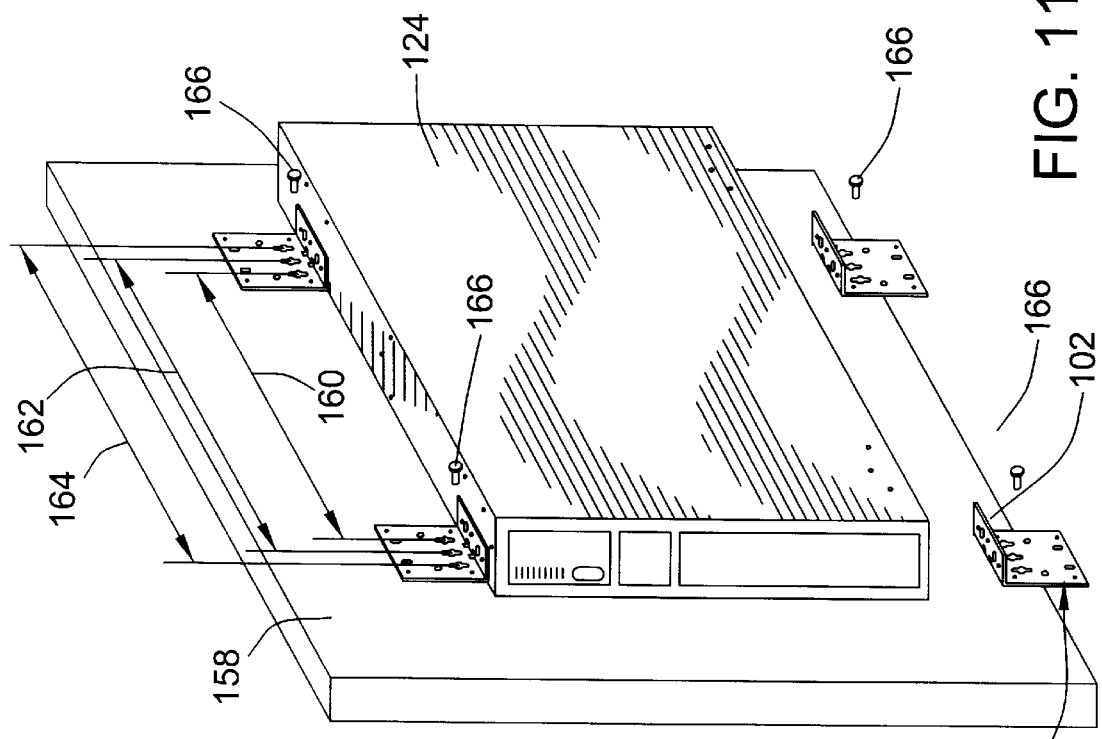
FIG. 11 is an isometric illustration of a modular electronic component constructed in accordance with the teachings of the present invention being mounted in a standard telco rack-mount cabinet.

FIG. 11 illustrates a wall-mounting configuration of the modular electronic component equipment housing 124 on a wall 158. As used in this configuration, the first portion 102 of mounting bracket 100 is secured to the component housing 124 utilizing mounting hole sets 130, 132, 130', and 132' as illustrated in FIGS. 2 and 3. In this configuration, the second portion 104 of mounting bracket 100 forms a mounting surface to be attached to the wall 158. To accommodate the various building standards to which walls are made, this second surface includes three wall-mount mounting holes $116_a$, $116_b$, $116_c$ as illustrated in FIG. 1. Once the mounting brackets 100 are positioned on the housing 124, the distance 160 between the innermost mounting holes accommodates 12-inch centers for the wall studs. If 14-inch centers were used to construct the wall 158, the middle set of mounting holes are utilized as the distance therebetween 162 accommodates such a building standard. Finally, if 16-inch centers were used in constructing the wall 158, the outermost mounting holes will be utilized since the distance 164 between these two mounting holes accommodates such a building standard. Once the appropriate mounting holes for the construction standard utilized to construct the wall 158 have been chosen, the modular electronic component may be mounted to the wall 158 by utilizing screws 166 or other appropriate mounting hardware.

While not specifically illustrated in FIGS. 8, 9 or 11, one skilled in the art will recognize that the aesthetic cover plates 156 may be utilized in these installation configurations to cover the mounting holes provided on the second portion 104 of mounting bracket 100 if so desired. To allow access to the mounting fasteners, this cover plate 156 may simply be removed, as it is preferably snap-fit onto the second portion 104 via mounting holes $118_a$, $118_b$ illustrated in FIG. 1.

FIGS. 12–17 provide planar views of each of the 6 sides of the universal mounting bracket 100 of the present invention to aid in a fuller understanding thereof.

In one embodiment of the present invention, the modular electronic component equipment comprises an uninterruptible power supply module contained in housing 124. As such, this single uninterruptible power supply module may be utilized in a 19-inch rack-mount configuration, a 23-inch rack-mount configuration, a telco rack-mount configuration, a tower-mount configuration, or in a wall-mount configuration based solely on the discretion of the business. Through the system of the instant invention, these uninterruptible power supply modules may be reconfigured as desired by the business owner to suit his or her current needs, all without the requirement of purchasing additional or different hardware.

As an example, a business owner may begin by purchasing a single uninterruptible power supply module and mounting it on the wall to supply his power needs. As the business grows, and the need for uninterruptible power increases, additional modules may be purchased to form an integrated, uninterruptible power supply system (UPS). With such an integrated system, it may no longer be appropriate to maintain a wall-mounting configuration. At such a point the wall-mount modules may be removed from the wall and set up in a tower-mount configuration merely by re-orienting the universal mounting bracket 100 on the UPS modules. As the business' power supply requirements continue to increase, the business owner may choose to purchase rack-mount enclosures or cabinets to house the growing number of modular components utilized in his business. As with the prior transformation from wall-mount to tower-mount, the UPS modules may be, once again, reconfigured to mount in the rack-mount cabinets by merely re-orienting the universal mounting brackets 100 in the proper configuration to allow for mounting in a 19-inch, 23-inch, or telco rack-mount cabinet. In each of these different configurations, the identical, uninterruptible power supply module may be utilized.

The foregoing description of various preferred embodiments of the invention has been presented for purposes of illustration and description. It is not intended to be exhaustive or to limit the invention to the precise forms disclosed. Obvious modifications or variations are possible in light of the above teachings. The embodiments discussed were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the apprended claims when interpreted in accordance with the breadth to which they are fairly, legally, and equitably entitled.

What is claimed is:

1. A modular component equipment assembly having universal mounting capability, comprising:

a housing; and a pair of universal mounting brackets each having a first portion, and a second portion arranged in perpendicular relation to and being wider than the first portion, the first portion defining therein a first set of bracket mounting holes, the second portion defining therein a second set of bracket mounting holes; and wherein the first portion of the universal mounting brackets are attached to the housing on either side thereof to form wide outward depending mounting flanges, the second set of bracket mounting holes being positioned on the second portion such that a distance between the second set of bracket mounting holes on each universal mounting bracket when attached to the housing is adapted to align with external mounting holes on an external rack mount chassis of a first size; and wherein the second portion of the universal mounting brackets are attached to the housing on either side thereof to form short outward depending mounting flanges, the first set of bracket mounting holes being positioned on the first portion such that a distance between the first set of bracket mounting holes on each universal mounting bracket when attached to the housing is adapted to align with external mounting holes on an external rack mount chassis of a second size smaller than the first size.

2. The assembly of claim 1, wherein the housing defines a first and a second set of mounting holes on two sides thereof;

wherein the first portion defines a first set of housing mounting holes adapted to align with the first set of mounting holes of the housing; and wherein the second portion defines a second set of housing mounting holes adapted to align with the second set of mounting holes of the housing.

3. The assembly of claim 1, wherein the housing is oriented in a tower mount configuration, and wherein the first portion of the universal mounting brackets are attached to opposite sides of the housing at a lower portion thereof relative to the tower mount orientation such that the second portion forms mounting feet to increase the stability thereof.

4. The assembly of claim 3, wherein the housing defines a third set of mounting holes on opposite sides of the housing at the lower portion thereof, and wherein the first portion defines a first set of housing mounting holes adapted to align with the third set of mounting holes of the housing.

5. The assembly of claim 1, wherein the universal mounting brackets further define a plurality of wall mounting holes in the second portions thereof, wherein the housing is oriented in a wall mount configuration, and wherein the first portion of the universal mounting brackets are attached to at least one side of the housing in a spaced relationship to an adjacent universal mounting bracket such that a first distance between an inner-most pair of wall mounting holes on adjacent universal mounting brackets align with wall studs constructed with centers at a first distance, such that a second distance between a middle pair of wall mounting holes on adjacent universal mounting brackets align with wall studs constructed with centers at a second distance, and such that a third distance between an outer-most pair of wall mounting holes on adjacent universal mounting brackets align with wall studs constructed with centers at a third distance.

6. A modular component equipment assembly having universal mounting capability, comprising:

a housing; and a pair of universal mounting brackets each having a first portion, and a second portion arranged in perpendicular relation to and being wider than the first portion, the first portion defining therein a first set of bracket mounting holes, the second portion defining therein a second set of bracket mounting holes; and wherein the first portion of the universal mounting brackets are attached to the housing on either side thereof to form wide outward depending mounting flanges, the second set of bracket mounting holes being positioned on the second portion such that a distance between the second set of bracket mounting holes on each universal mounting bracket when attached to the housing is adapted to align with external mounting holes on an external rack mount chassis of a first size; and wherein the second portion of the universal mounting brackets are attached to the housing on either side thereof to form short outward depending mounting flanges, the first set of bracket mounting holes being positioned on the first portion such that a distance between the first set of bracket mounting holes on each universal mounting bracket when attached to the housing is adapted to align with external mounting holes on an external rack mount chassis of a second size smaller than the first size; and wherein the second portion further defines therein a plate cover mounting hole, further comprising aesthetic plate covers snap fit in the plate cover mounting hole.

7. The assembly of claim 1, wherein the housing forms a rectangular box having a front surface whose width exceeds its height, a pair of side walls, a top surface, and a bottom surface, wherein the universal mounting brackets are attached to the pair of side walls to enable mounting of the housing in a rack-mount and a telco-mount chassis, the mounting flanges so formed extending parallel with the front surface, wherein the first portion of the universal mounting brackets are attached to the top and bottom surfaces to enable a tower mounting of the housing, the second portions forming mounting feet extending perpendicular to the front surface, and wherein the first portion of the universal mounting brackets are attached to the pair of side walls to enable a wall mounting of the housing, the second portions forming wall mounting flanges extending perpendicular to the front surface.

8. The assembly of claim 7, wherein the first portion defines a first set of housing mounting holes and the second portion defines a second set of housing mounting holes, wherein the pair of side walls define a first and a second set of mounting holes positioned to align with the first and the second set of mounting holes, respectively, to enable rack mounting of the housing in a first and a second sized rack mount chassis, a third set of mounting holes to enable mounting in a telco rack mount chassis, and a fourth and fifth set of mounting holes each positioned to align with the first set of housing mounting holes to enable wall mounting of the housing; and wherein the top and bottom surfaces define a sixth and seventh set of mounting holes each positioned to align with the first set of housing mounting holes to enable tower mounting of the housing.

9. A universal mounting bracket for use with modular component equipment, comprising:

a first portion defining therein a first set of housing mounting holes and a first set of rack mounting holes;

a second portion defining therein a second set of housing mounting holes and a second set of rack mounting holes, the second portion being positioned perpendicular to the first portion and having a length greater than a length of the first portion;

wherein the second set of rack mounting holes are positioned along the length of the second portion such that they align with external mounting holes of a first rack mount chassis when the bracket is mounted to the modular component equipment; and wherein the first set of rack mounting holes are positioned along the length of the first portion such that they align with external mounting holes of a second rack mount chassis that is smaller than the first rack mount chassis when the bracket is mounted to the modular component equipment.

10. The bracket of claim 9, wherein the second portion further defines therein a first wall mount hole.

11. The bracket of claim 10, wherein the second portion further defines a second wall mount hole positioned a first distance from the first wall mount hole, the first distance being one half of a distance differential between building standards for wall stud placement.

12. The bracket of claim 11, wherein the second portion further defines a third wall mount hole positioned the first distance from the second wall mount hole.

13. The bracket of claim 12, wherein each of the first and second and the second and third wall mount holes are positioned approximately one inch from each other.

14. The bracket of claim 12, wherein the second portion further defines an aesthetic cover mounting hole therein.

15. The bracket of claim 14, comprising a flat metal plate into which the first and second sets of housing mounting holes, the first and second set of rack mounting holes, the first, second, and third wall mount holes, and the aesthetic cover mounting hole are punched, the first and the second portion being formed by bending the metal plate.

16. The bracket of claim 9, wherein the first portion further defines a pair of clearance holes positioned therein.

17. The bracket of claim 9, wherein the second set of rack mounting holes are positioned along the length of the second portion such that they align with external mounting holes of a 23-inch rack mount chassis when the bracket is mounted to the modular component equipment, and wherein the first set of rack mounting holes are positioned along the length of the first portion such that they align with external mounting holes of a 19-inch rack mount chassis when the bracket is mounted to the modular component equipment.

18. A modular uninterruptible power supply (UPS) system for supplying electric power from line voltage and external batteries, comprising:

an UPS module; and a plurality of universal mounting brackets adapted to couple to the UPS module in a first position to enable mounting of the UPS module in a first rack mount chassis, in a second position to enable mounting of the UPS module in a second rack mount chassis wider than the first rack mount chassis, in a third position to enable mounting of the UPS module in tower mount configuration, in a fourth position to enable mounting of the UPS module on a wall, and in a fifth position to enable mounting of the UPS module in a telco rack mount chassis.

19. The UPS system of claim 18, wherein the universal mounting bracket comprises a first and a second portion, the second portion being wider than the first portion, and wherein the second portion is coupled to the UPS module in the first position, and wherein the first portion is coupled to the UPS in the second, third, fourth, and fifth positions.

20. The UPS system of claim 18, further comprising:
at least a second UPS module and a joinder plate; and
wherein the UPS modules are positioned adjacent to one another in the tower mount configuration;
wherein the joinder plate is coupled to the adjacent UPS modules to maintain a relative position thereof; and
wherein the universal mounting brackets are coupled in the third position to an outside surface of the UPS modules to form mounting feet.

21. The UPS system of claim 18, wherein at least two universal mounting brackets are coupled on a same horizontal side of the UPS module in the fourth position, wherein the universal mounting bracket includes at least two wall mount holes defined therein, and wherein the wall mount holes are positioned relative to one another such that one of the wall mount holes from each universal mounting bracket will align with an external wall stud center of a wall constructed in accordance with a first standard, and such that the other of the wall mount holes from each universal mounting bracket will align with an external wall stud center of a wall constructed in accordance with a second standard.

22. The UPS system of claim 21, wherein the universal mounting bracket includes a third wall mount hole defined therein, and wherein the wall mount holes are positioned relative to one another such that the third of the wall mount holes from each universal mounting bracket will align with an external wall stud center of a wall constructed in accordance with a third standard.

* * * * *